United States Patent
Chou

(10) Patent No.: US 7,352,147 B2
(45) Date of Patent: Apr. 1, 2008

(54) POWER SUPPLY TO PROVIDE OPERATION POWER FOR COOLING FANS

(75) Inventor: Chin-Wen Chou, Taipei Hsien (TW)

(73) Assignee: Zippy Technology Corp., Taipei Hsien (TW)

( * ) Notice: Subject to any disclaimer, the term of this patent is extended or adjusted under 35 U.S.C. 154(b) by 315 days.

(21) Appl. No.: 11/263,825

(22) Filed: Nov. 2, 2005

(65) Prior Publication Data
US 2007/0097721 A1   May 3, 2007

(51) Int. Cl.
*H02P 3/00* (2006.01)
(52) U.S. Cl. ............ 318/471; 318/472; 318/473; 307/64; 361/687; 713/300
(58) Field of Classification Search ........ 318/471–473; 307/64; 713/300; 361/687
See application file for complete search history.

(56) References Cited

U.S. PATENT DOCUMENTS

| | | | | |
|---|---|---|---|---|
| 6,163,087 A * | 12/2000 | Huang et al. | | 307/64 |
| 6,349,385 B1 * | 2/2002 | Kaminski et al. | | 713/300 |
| 6,400,045 B1 * | 6/2002 | Hosokawa et al. | | 307/117 |
| 6,643,128 B2 * | 11/2003 | Chu et al. | | 361/687 |
| 6,654,894 B2 * | 11/2003 | Kaminski et al. | | 713/300 |
| 6,665,163 B2 * | 12/2003 | Yanagisawa | | 361/103 |
| 6,934,864 B2 * | 8/2005 | Chu et al. | | 713/324 |
| 6,935,130 B2 * | 8/2005 | Cheng et al. | | 62/259.2 |
| 7,177,131 B2 * | 2/2007 | Chen et al. | | 361/93.9 |
| 2002/0059533 A1 * | 5/2002 | Kaminski et al. | | 713/300 |
| 2003/0011984 A1 * | 1/2003 | Chu et al. | | 361/687 |
| 2003/0135767 A1 * | 7/2003 | Chu et al. | | 713/300 |
| 2004/0125547 A1 * | 7/2004 | Tsung | | 361/676 |
| 2004/0165355 A1 * | 8/2004 | Chen | | 361/709 |
| 2004/0230845 A1 * | 11/2004 | Su | | 713/300 |
| 2004/0264125 A1 * | 12/2004 | Cheng et al. | | 361/687 |
| 2005/0217300 A1 * | 10/2005 | Cheng et al. | | 62/259.2 |
| 2006/0032250 A1 * | 2/2006 | Flanigan et al. | | 62/157 |
| 2007/0224030 A1 * | 9/2007 | Chang et al. | | 415/47 |

FOREIGN PATENT DOCUMENTS

| | | | |
|---|---|---|---|
| TW | 392106 A | 6/2000 | |
| TW | 400968 A | 8/2000 | |
| TW | 568300 A | 12/2003 | |
| TW | 572579 A | 1/2004 | |
| TW | M247876 U | 10/2004 | |
| TW | M268654 U | 6/2005 | |

* cited by examiner

*Primary Examiner*—Paul Ip
(74) *Attorney, Agent, or Firm*—Birch, Stewart, Kolasch & Birch, LLP

(57) ABSTRACT

A power supply to provide operation power for cooling fans includes a non-stop power system to provide DC power in normal conditions to a remote switch control circuit to set a computer in an ON or OFF condition. The non-stop power system also outputs the DC power to a fan actuation control circuit to drive a rear end cooling fan. The fan actuation control circuit and the remote switch control circuit are bridged by a cooling delay unit. The cooling delay unit receives a computer ON/OFF signal from the remote switch control circuit and outputs another signal to enable the cooling fan to operate for a period of time before stopping.

11 Claims, 2 Drawing Sheets

POWER SUPPLY TO PROVIDE OPERATION POWER FOR COOLING FANS

FIELD OF THE INVENTION

The present invention relates to a power supply to provide operation power for cooling fans and particularly to a power supply installed in a computer to provide power to drive a cooling fan to reduce temperature even when the computer is in a shutdown condition.

BACKGROUND OF THE INVENTION

In response to the cooling problem of computers that still has accumulated heat energy not being dispelled in a shutdown condition, R.O.C. patent publication No. 392106 discloses a technique which outputs a fan switch control signal through a south bridge chip set that passes through a control circuit to a fan power switch and a switch circuit to switch power supply of a cooling fan in the shutdown condition. R.O.C. patent publication No. 400968 discloses a power supply that has a non-stop power system, a main power supply system and a delay switch device which is electrically connected to a cooling fan that can switch to supply different power to drive the cooling fan when the computer is in an ON or OFF condition. The technique of No. 400968 is mostly adopted in the present market. There are some other techniques developed based on this approach, such as R.O.C. patent publication Nos. 572579 and 568300, and Pat. Nos.

SUMMARY OF THE INVENTION

The primary object of the present invention is to solve the disadvantages of the aforesaid techniques. The invention also is based on R.O.C. patent publication No. 400968. The main features of the invention include: a power supply has a non-stop power system which outputs DC power in normal conditions to a remote switch control circuit that sets a computer in an ON or OFF condition. In addition, the non-stop power system outputs the DC power to a fan actuation control circuit to drive a rear end cooling fan. The fan actuation control circuit and the remote switch control circuit are bridged by a cooling delay unit which receives a signal output by the remote switch control circuit to shut down the computer and outputs a signal to enable the cooling fan to continuously operate for a period of time before stopping.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENTS

Figure 1:
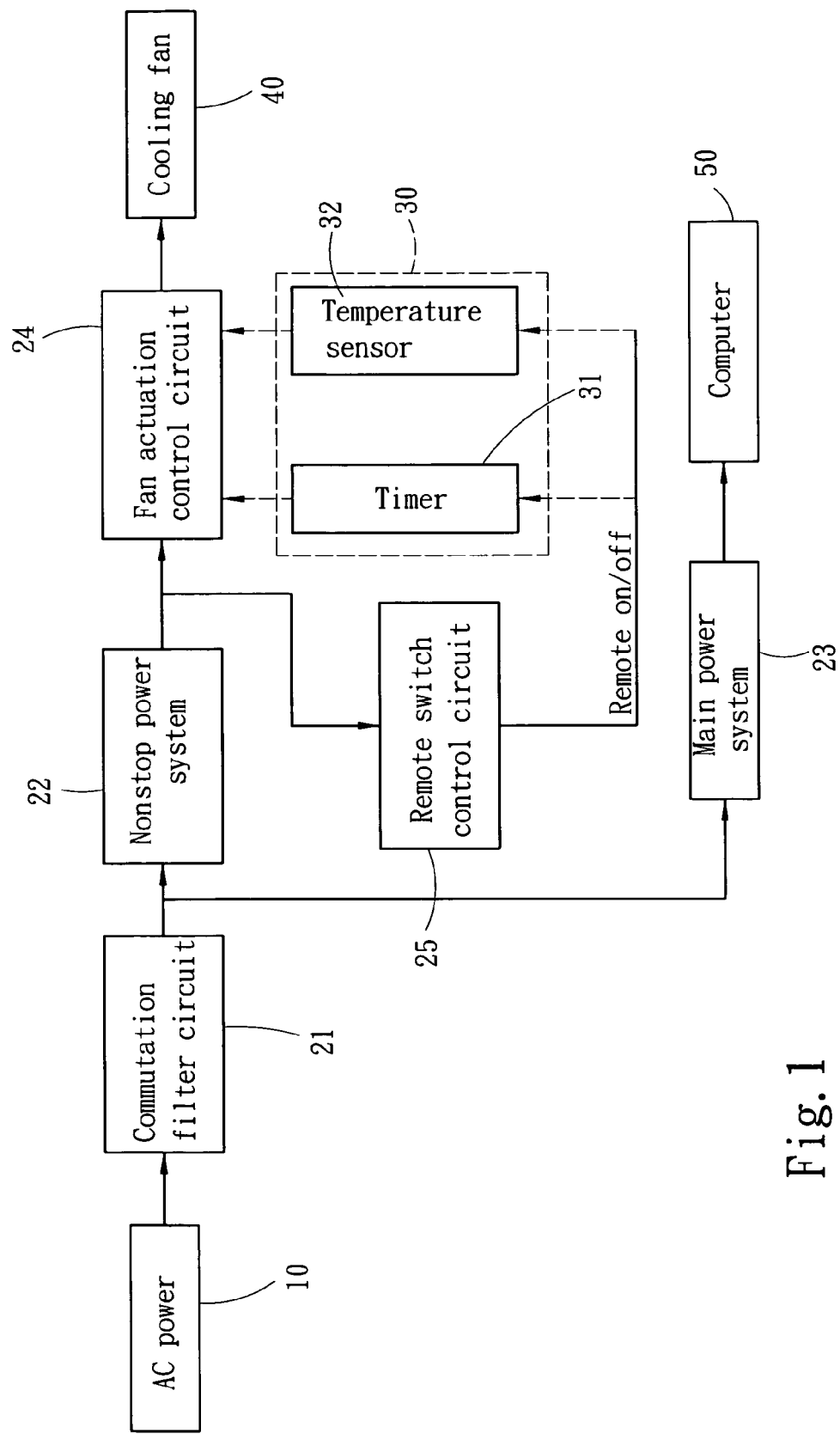
FIG. 1 is a circuit block diagram of a first embodiment of the present invention.

Please refer to FIG. 1 for the circuit block diagram of a first embodiment of the invention. The power supply of the invention aims to provide operation power for a cooling fan 40. The power supply transforms an AC power 10 to a DC power. It provides the DC power through a commutation filter circuit 21, and includes at least a non-stop power system 22 that transforms the AC power 10 to the DC power in normal conditions and a main power system 23 that transforms the AC power to the DC power when the power supply is in an ON condition to supply a computer 50 for operation. The features of the invention include to output the DC power from the non-stop power system 22 in normal conditions to a remote switch control circuit 25 that sets the computer 50 in an ON or OFF condition. And the non-stop power system 22 also outputs the DC power to a fan actuation control circuit 24 to drive the rear end cooling fan 40. The fan actuation control circuit 24 and the remote switch control circuit 25 are bridged by a cooling delay unit 30 which receives a signal output from the remote switch control circuit 25 that sets the computer 50 to the OFF condition, and outputs another signal to drive the cooling fan 40 to continuously operate for a period of time before stopping.

The cooling fan 40 may include, but not limited to various types of cooling fans installed in the power supply, CPU or computer 50. As shown in the first embodiment, the cooling delay unit 30 may include a timer 31 or a temperature sensor 32 or the combination thereof. When the computer 50 is set in an ON condition through the remote switch control circuit 25, the non-stop power system 22 directly supplies the power to the fan actuation control circuit 24 to drive the cooling fan 40. When the computer 50 is set in an OFF condition through the remote switch control circuit 25, the cooling delay unit 30 receives a Remote off signal from the computer 50 and at the same time, based on a preset time period of the timer 31 or a preset temperature of the temperature sensor 32 of the cooling delay unit 30, the fan actuation control circuit 24 continuously drives the cooling fan 40 to operate for a period of time before stopping. The cooling delay unit 30 receives the ON signal of the computer 50 output from the remote switch control circuit 25, then outputs a Remote on signal to activate operation of the cooling fan 40. The OFF signal of the computer 50 received by the cooling delay unit 30 is originated from the remote switch control circuit 25 or transferred by the fan actuation control unit 24. Namely the fan actuation control unit 24 receives the Remote on signal of the computer 50 output from the remote switch control circuit 25 to drive the cooling fan 40.

Figure 2:
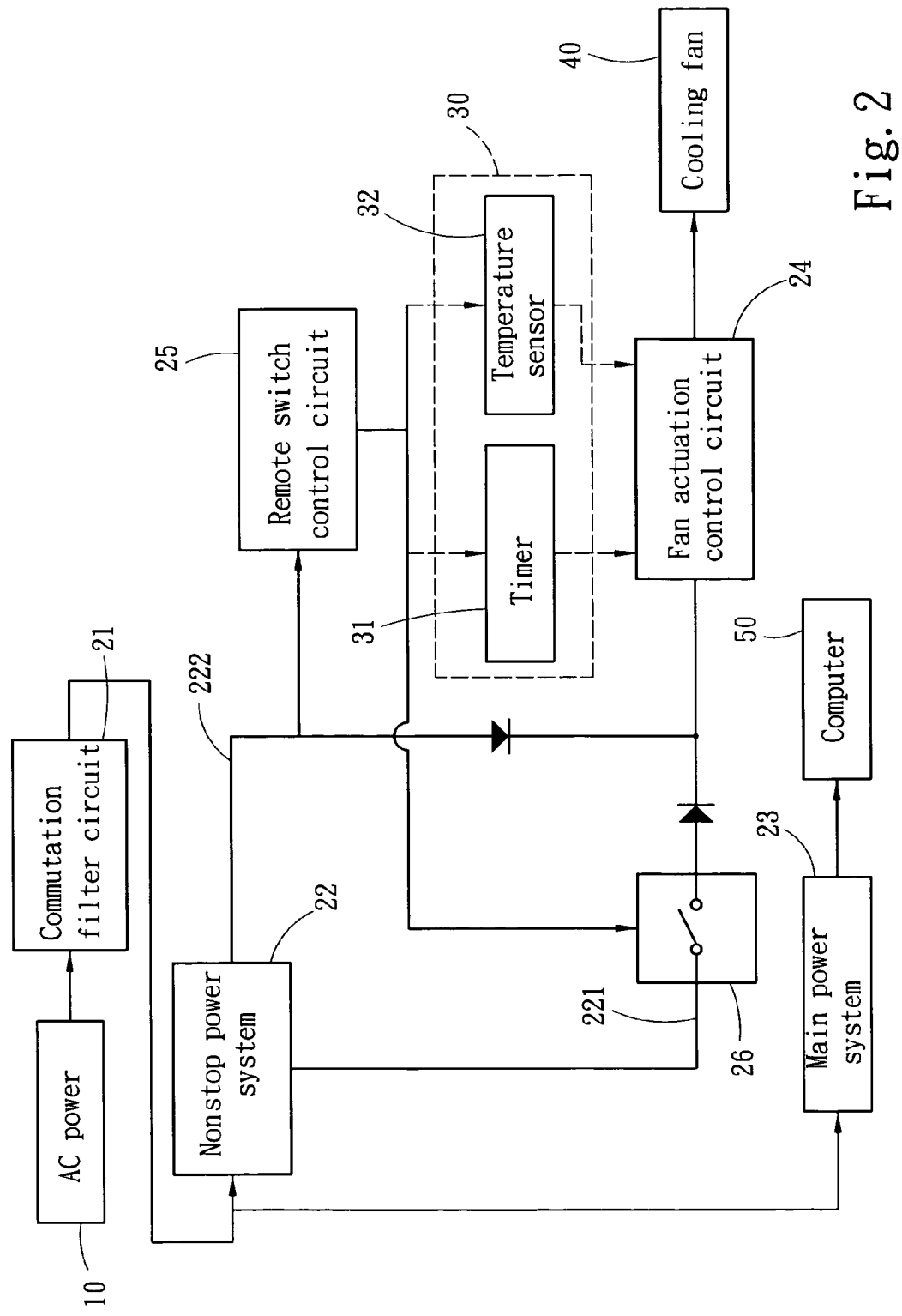
FIG. 2 is a circuit block diagram of a second embodiment of the present invention.

Refer to FIG. 2 for the circuit block diagram of a second embodiment of the invention. In this embodiment, the non-stop power system 22 has a higher potential DC circuit 221 and a lower potential circuit 222 that provide DC power of different voltages to the fan actuation control circuit 24 and the rear end cooling fan 40. The cooling fan 40 is driven by the higher potential DC power when the computer 50 is in the ON condition. The cooling fan 40 is driven by the lower potential DC power when the computer 50 is in the OFF condition. The higher potential circuit 221 has a switch circuit 26 which is closed (ON) when the computer 50 is in the ON condition, and open (OFF) when the computer 50 is in the OFF condition. The switch circuit 26 receives Remote on/off signals from the remote switch control circuit 25 that set the computer 50 in the ON/OFF conditions to switch the circuit in the closed/open conditions. Operation principle is same as the first embodiment previously discussed. The remote switch control circuit 25 and the fan actuation control unit 24 are bridged by the cooling delay unit 30 which enables the cooling fan 40 to continuously operate for a period of time after the computer 50 is shut down to dispel the residual heat accumulated in the power supply or computer 50.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. A power supply to provide operation power for cooling fans to transform an AC power to a DC power comprising at least a non-stop power system that transforms the AC power to the DC power in normal conditions and a main power system that transforms the AC power to the DC power when the power supply is in an ON condition to supply a computer for operation;

wherein the non-stop power system outputs the DC power to a remote switch control circuit in the normal conditions that set the computer in an ON or OFF condition, and to a fan actuation control circuit to drive a rear end cooling fan, the fan actuation control circuit and the remote switch control circuit being bridged by a cooling delay unit which receives a computer OFF signal output from the remote switch control circuit and outputs a first signal to drive the cooling fan to continuously operate for a period of time.

2. The power supply of claim 1, wherein the cooling delay unit is a timer.

3. The power supply of claim 1, wherein the cooling delay unit is a temperature sensor.

4. The power supply of claim 1, wherein the cooling delay unit is a combination of a timer and a temperature sensor.

5. The power supply of claim 1, wherein the cooling delay unit receives a computer ON signal output from the remote switch control circuit and outputs a second signal to activate the cooling fan to operate.

6. The power supply of claim 1, wherein the computer OFF signal received by the cooling delay unit is originated from the remote switch control circuit.

7. The power supply of claim 1, wherein the computer OFF signal received by the cooling delay unit from the remote switch control circuit is transferred by the fan actuation control circuit.

8. The power supply of claim 7, wherein the fan actuation control circuit receives a computer ON signal from the remote switch control circuit to drive the cooling fan to operate.

9. The power supply of claim 1, wherein the non-stop power system provides a higher potential DC power and a lower potential DC power to the fan actuation control circuit and the rear end cooling fan, the cooling fan being driven by the higher potential DC power when the computer is in the ON condition, the cooling fan being driven by the lower potential DC power when the computer is in the OFF condition.

10. The power supply of claim 9, wherein the higher potential DC power is supplied through a circuit of the non-stop power system that has a switch circuit, the switch circuit being closed (ON) when the computer is in the ON condition and open (OFF) when the computer is in the OFF condition.

11. The power supply of claim 10, wherein the switch circuit receives signals from the remote switch control circuit that set the computer in ON/OFF conditions to be switched in a closed/open condition.

* * * * *